(12) United States Patent
Kuhlman

(10) Patent No.: US 9,922,937 B2
(45) Date of Patent: Mar. 20, 2018

(54) SELF-SHIELDED DIE HAVING ELECTROMAGNETIC SHIELDING ON DIE SURFACES

(71) Applicant: Avago Technologies General IP (Singapore) Pte. Ltd., Singapore (SG)

(72) Inventor: Mark Kuhlman, Laguna Niguel, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/224,538

(22) Filed: Jul. 30, 2016

(65) Prior Publication Data

US 2018/0033737 A1    Feb. 1, 2018

(51) Int. Cl.
| | |
|---|---|
| H01L 23/552 | (2006.01) |
| H05K 1/11 | (2006.01) |
| H03H 9/02 | (2006.01) |
| H01L 23/498 | (2006.01) |
| H01L 23/60 | (2006.01) |
| H01L 25/065 | (2006.01) |

(52) U.S. Cl.
CPC ...... *H01L 23/552* (2013.01); *H01L 23/49827* (2013.01); *H01L 23/49833* (2013.01); *H01L 23/49838* (2013.01); *H01L 23/60* (2013.01); *H01L 25/0655* (2013.01); *H03H 9/02086* (2013.01); *H03H 9/02913* (2013.01); *H05K 1/111* (2013.01)

(58) Field of Classification Search
None
See application file for complete search history.

(56) References Cited

U.S. PATENT DOCUMENTS

| | | |
|---|---|---|
| 6,265,246 B1 | 7/2001 | Ruby et al. |
| 6,953,990 B2 | 10/2005 | Gallup et al. |
| 7,187,253 B2 | 3/2007 | Sano et al. |
| 8,232,845 B2 | 7/2012 | Ruby et al. |
| 8,610,333 B2 | 12/2013 | Pang et al. |
| 2008/0210462 A1* | 9/2008 | Kawagishi ............ H01L 21/561 174/377 |
| 2015/0364429 A1* | 12/2015 | Lee ........................ H01L 23/552 257/659 |

* cited by examiner

Primary Examiner — Cory Eskridge

(57) ABSTRACT

A self-shielded die includes a substrate, an electronic device attached to the substrate, one or more electrical pads disposed on a bottom surface of the substrate, and an electromagnetic interference (EMI) shield formed of at least one electrically conductive material and connected to ground. At least one of the one or more electrical pads is electrically connected to the electronic device. The EMI shield includes a top shield layer, disposed directly on and substantially completely covering a top surface of the substrate opposite the bottom surface of the substrate, and side shield layers substantially completely covering all sides of the substrate, extending between the top surface of the substrate and the bottom surface of the substrate.

22 Claims, 9 Drawing Sheets

SELF-SHIELDED DIE HAVING ELECTROMAGNETIC SHIELDING ON DIE SURFACES

BACKGROUND

Various small electronic devices, commonly referred to as "dies," are employed in radio frequency (RF) wireless communication devices. Conventionally, such electronic devices are attached to substrates (such as metal lead frames, laminate circuit boards, ceramic based board, or silicon based boards, for example), encapsulated, and covered with external shields (often referred to as "cans") to form discrete shielded packages, which may be referred to as "modules." The various types of electronic devices included in such shielded packages may include bulk acoustic wave (BAW) resonators, such as thin film bulk acoustic resonators (FBARs) and surface mounted resonators (SMRs), and/or surface acoustic wave (SAW) resonators, amplifier, transistors, transducers, and the like. The acoustic resonators may form RF transmit and receive filters, for example, corresponding to various transmit and receive frequency bands utilized by the wireless communication devices.

A conventional shielded package includes an encapsulation (e.g., reinforced or non-reinforced molding resin or mold compound) that covers the substrate and the electronic devices (e.g., "die") with the package. An external shield generally includes electrically grounded metal layers that surround or cover the top and sidewalls of the package (including the mold compound and the package substrate), and protects the electronic devices within the shielded package against externally generated electromagnetic radiation ("external electromagnetic radiation"), preventing electromagnetic interference (EMI). The bottom of the shielded package is typically not covered by external metal layers, although the package substrate, ground layer(s), external connecting pins protruding from the substrate, and/or various electronic devices, transmission lines and other circuitry within the substrate generally provide sufficient external shielding from external electromagnetic radiation from the bottom of the shielded package.

In addition to the external shields, a conventional package may include metal cans, wires, and/or wire mesh formed between and/or around the electronic devices (or dies) to create device EMI shielding from internally generated electromagnetic radiation ("internal electromagnetic radiation"). The internal shields thus prevent EMI from occurring between and among the electronic devices within the shielded package. Conventionally, the internal shields are applied after attachment of the electronic devices to the package substrate. Various types of internal shields include but are not limited to wirebond loops assembled between electronic devices or surrounding particular electronic devices, metal filled trenches formed in mold compound between electronic devices or surrounding particular electronic devices, and/or wirebonds, wire mesh or metal lid formed over particular electronic devices. Such internal shields are assembled at the package level, meaning that the internal shields are added after the package has been at least partially fabricated, as mentioned above. For example, wirebond loops may be formed on a surface of the circuit board before application of the mold compound, while trenches may be formed after application of the mold compound (e.g., by laser ablation through the mold compound). The external shield is then applied over the mold compound and the electronic compounds and internal shields contained therein (e.g., using chemical vapor deposition or spraying) to provide the shielded package.

Formation of internal shields requires additional space between the electronic devices in the shielded package to accommodate placement of the internal shields. This typically results in the shielded package (and possibly the wireless communications device in which it is contained) to be larger. For example, providing a row of wirebond loops between two electronic devices on a circuit board requires approximately an additional 90 to 120 µm of separation, while providing a metal filled or lined trench between two electronic devices requires approximately an additional 100 to 175 µm of separation. However, the trend in design of RF wireless communication devices, such as cellular phones, has been to add more transmit and receive bands for worldwide usage, without increasing (or even possibly reducing) the size of the communication devices. Further demand is directed to increasing the number of bands and tightening filter performance requirements to allow cellular phones to receive and/or transmit through multiple bands, simultaneously. As these trends continue, RF isolation between transmit and receive filters in cellular phones becomes more critical. Accordingly, what is needed is shielding from both external and internal electromagnetic radiation that occupies less space in a shielded package and/or is easy to fabricate, while maintaining or improving EMI protection.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

DETAILED DESCRIPTION

Figure 1A:
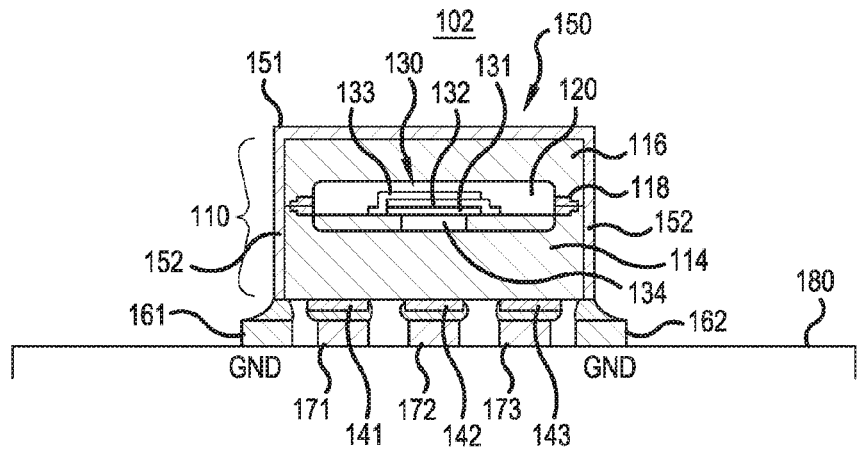
FIG. 1A is a simplified cross-sectional view of an EMI self-shielded die with an attached EMI shield directly grounded to ground pads, according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" or "a component" includes one device and plural devices or components. The terms "substantial" or "substantially" mean to within acceptable limits or degree to one of ordinary skill in the art. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

To address the design challenges of providing external EMI shielding for more bands, various embodiments of the disclosure provide EMI shields applied to the surfaces of the dies themselves, which effectively forms Faraday cages around the electronic devices of the dies. In various embodiments, side shields of the EMI shields may be created at a wafer level by wafer level deposits of conductive material or layers, e.g., enabling greater precision and uniformity, while the circuit devices are still part of a common wafer, as compared to conductive material applied to the circuit devices on at least corresponding top surfaces after separation from the common wafer.

Generally, according to various embodiments, a self-shielded die is provided. The self-shielded die includes a substrate, an electronic device attached to the substrate, one or more electrical pads disposed on a bottom surface of the substrate, and an EMI shield formed of at least one electrically conductive material and connected to ground. At least one of the one or more electrical pads is electrically connected to the electronic device. The EMI shield includes a top shield layer, disposed directly on and substantially completely covering a top surface of the substrate opposite the bottom surface of the substrate, and side shield layers substantially completely covering all sides of the substrate, extending between the top surface of the substrate and the bottom surface of the substrate. Because the die is self-shielded, there is no need to leave additional space on a package substrate, to which the self-shielded die is attached, to be available for assembly of a separate EMI shield between the self-shielded die and an adjacent die (which may likewise be a self-shielded die). Thus, for example, the distance between the adjacent self-shielded dies may be less than about 90 μm (the typical minimum space needed for providing a row of wirebond loops between two electronic devices.

Figure 1B:
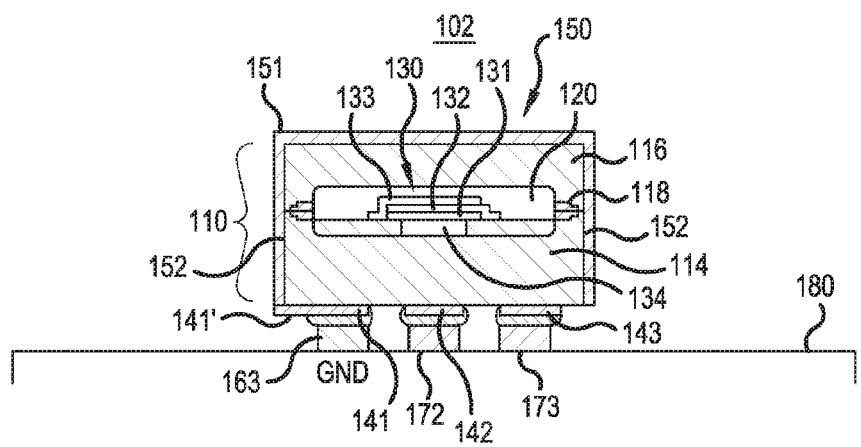
FIG. 1B is a simplified cross-sectional view of a self-shielded die with an attached EMI shield grounded via a metal extension in contact with a side shield layer, according to a representative embodiment.
Figure 1C:
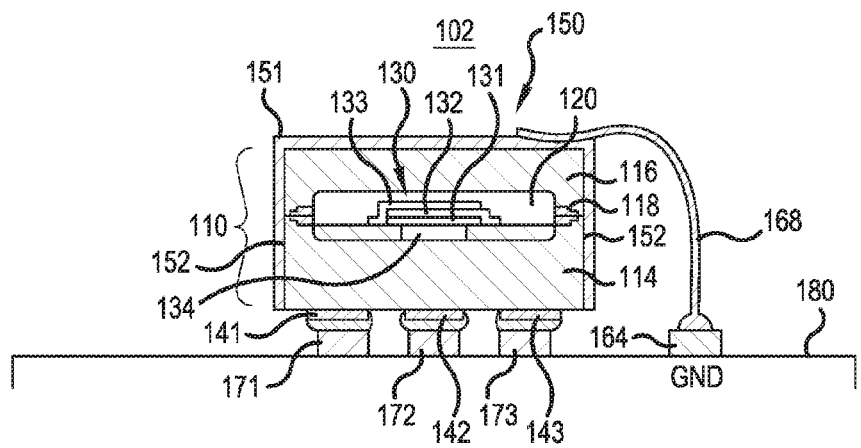
FIG. 1C is a simplified cross-sectional view of a self-shielded die with an attached EMI shield grounded via a bond wire, according to a representative embodiment.

FIGS. 1A to 1C are cross-sectional diagrams of an illustrative self-shielded die, having different grounding configurations, respectively, according to representative embodiments. The term "self-shielded" refers to the die having a layer of conductive material (e.g., metal) applied directly to one or more sides of the die, as opposed to conductive material being applied to outer surface(s) of a shielded package containing the die or features (e.g., wirebonds, trenches, etc.) comprising conductive material formed within the shielded package between or around dies. The examples shown in FIGS. 1A to 1C include a self-shielded die (102) configured for accommodating an acoustic filter, such as a BAW resonator (e.g., an FBAR or a SMR), positioned within a cavity formed between bonded substrates (e.g., base substrate 114 and lid substrate 116). It is understood, however, that various embodiments of self-shielded dies are not limited to the bonded substrate configuration and/or acoustic filters. Self-shielded dies may include devices with or without cavities and include BAW or SAW resonators as well as other types of electronic devices, positioned within a cavity or on a surface of the die. For example, self-shielded dies may include flip-chip devices, surface mount technology (SMT) devices, complementary metal-oxide-semiconductor (CMOS) devices, and the like, without departing from the scope of the present teachings.

Referring to FIGS. 1A to 1C, the self-shielded die 102 includes a hybrid substrate 110 having a base substrate 114 and a lid substrate 116 bonded together, the bonding area indicated by line 118. Each of the base substrate 114 and the lid substrate 116 is formed of a substrate material compatible with semiconductor processes, such as silicon (Si), gallium arsenide (GaAs), indium phosphide (InP), glass, sapphire, alumina, epoxy, bismaleimide triazine (BT), prepreg composites, reinforced or non-reinforced polymer dielectrics, for example. In some embodiments, the base substrate 114 and the lid substrate 116 are made of materials that have the same or approximately the same coefficient of thermal expansion (CTE) as each other to avoid thermal expansion mismatch problems. In alternative configurations, the base substrate 114 and lid substrate 116 may be made of the same material or different material.

The self-shielded die 102 defines a cavity 120 in which an acoustic filter, comprising at least one acoustic resonator, is arranged, as indicated by representative FBAR 130. The acoustic resonator includes at least one electrode for enabling electrical connection. For example, the FBAR 130 includes a pair of electrodes 131, 133 and a piezoelectric layer 132 arranged between the electrodes 131, 133, and stacked over FBAR cavity 134. Other types of acoustic resonators and/or electronic devices may be located in the cavity 120, or the cavity 120 may be excluded altogether, as mentioned above, without departing from the scope of the present teachings. When there is no cavity 120, the bonded base substrate 114 and lid substrate 116 may be replaced by a single substrate, such as a semiconductor or insulative wafer, without departing from the scope of the present teachings.

The self-shielded die 102 has one or more electrical pads, indicated by representative electrical pads 141, 142 and 143, disposed on a first (bottom) surface of the hybrid substrate 110, corresponding to an outer surface of the base substrate 114. At least one of the electrical pads 141, 142 and 143 is electrically connected to one of the resonator electrodes. In various embodiments, at least one copper pillar (not shown) may be provided on at least one of the electrical pads 141, 142 and 143. An EMI shield 150 substantially completely covers a second (top) surface of the hybrid substrate 110, corresponding to an outer surface of the lid substrate 116, and further substantially completely covers the sides of the hybrid substrate 110. "Covers" refers to being applied on the respective surfaces of the hybrid substrate 110, and/or on an intervening layer(s) that is applied on the respective surfaces of the hybrid substrate 100 (as opposed to having gaps between the top and/or sides of a circuit device an EMI shield). The EMI shield 150 effectively forms a Faraday cage around the electronic device (e.g., FBAR 130). In the depicted embodiments, the self-shielded die 102 has four sides for purposes of illustration, although the self-shielded die 102 is not limited to four sides, depending on design specifications.

The EMI shield 150 is formed of an electrically conductive material, such as copper (Cu), silver (Ag) or aluminum (Al), for example. The EMI shield 150 comprises a top shield layer 151 and side shield layers 152. The top shield layer 151 is applied to the second surface of the hybrid substrate 110 after the self-shielded die 102 has been separated from other dies, which were originally part of the same wafer (e.g. hybrid substrate wafer 310, discussed below) as the self-shielded die 102, during the fabrication process. The side shield layers 152 of the EMI shield 150, which extend from the second surface of the hybrid substrate 110 and the first surface of the hybrid substrate 110, may be applied along with the top shield layer at the package level, meaning after the self-shielded die 102 has been separated from the other dies. Or, in various embodiments, all or a portion of the side shield layers 152 may be applied at the wafer level, meaning before the self-shielded die 102 has been separated from the other dies in the same wafer. An example of applying the side shield layers 152 at the wafer level is described below, with reference to FIGS. 2 and 3A to 3H. When the side shield layers 152 are applied at the wafer level, some of the conductive material used to apply the top shield layer 151 following die singulation may also cover all or a portion of each the side shield layers 152.

When applied at the wafer level, the side shield layers 152 of the EMI shield 150 may be formed using trenching and subsequent metallization processes, as discussed below. The trenching and metallization processes enable better application control of the electrically conductive material that ultimately becomes the side shield layers 152. This results in the side shield layers 152 being substantially uniform in thickness, particularly as compared to the side shield layers 152 applied at the package level, which tend to be thicker at the top (adjacent the top shield layer 151) and taper off further down the sides of the self-shielded die 102. Further, the side shield layers 152 applied at the wafer level are substantially thinner than the top shield layer 151 applied at the package level, due to the differing methods of applying the conductive material(s). For example, a thickness of the top shield layer 151 may be about 1 to 3 μm, while a thickness of each of the side shield layers 152 may be about 0.5 to 1.5 μm.

The EMI shield 150 must be electrically grounded. FIGS. 1A to 1C show examples of different configurations for electrically grounding the EMI shield 150, although other configurations may be implemented, without departing from the scope of the present teachings. Referring to FIG. 1A, the EMI shield 150 is connected ground pads 161 and 162 (e.g., using solder, which forms a solder joint) and the electrical pads 141, 142 and 143 are connected to signal pads 171, 172 and 173, respectively (e.g., also using solder). The ground pads 161 and 162, and the signal pads 171 to 173, may be arranged on the top surface of a package substrate 180, such as a printed circuit board (PCB), a lead frame, a laminate circuit board, a ceramic or silicon based substrate, or the like, for example. In alternative configurations, the EMI shield 150 may be connected to only one of the ground pad 161 or 162, without departing from the scope of the present teachings.

Referring to FIG. 1B, the EMI shield 150 is directly connected to at least one of the electrical pads 141, 142 and 143 disposed on the first surface of the hybrid substrate 110. In the depicted configuration, the EMI shield 150 is directly connected to the electrical pad 141, although the EMI shield 150 may be directly connected to the electrical pads 142 or 143, instead of or in addition to the electrical pad 141, without departing from the scope of the present teachings. To enable the direct connection, the electrical pad 141 includes a metal extension 141' that extends across the first surface to the edge (or slightly beyond the edge) of the hybrid substrate 110. Accordingly, the side shield layer 152 on the same side of the hybrid substrate 110 as the electrical pad 141 contacts the metal extension 141'. The electrical pad 141 and/or the metal extension 141' are connected to a ground pad 163 (e.g., using solder), and the electrical pads 142 and 143 are connected to the signal pads 172 and 173, respectively (e.g., also using solder), as discussed above.

Referring to FIG. 1C, the EMI shield 150 is directly connected to a ground pad 164, which may be arranged on the top surface of the package substrate 180, via a bond wire 168. That is, a first end of the bond wire 168 is connected to the top shield layer 151 of the EMI shield 150, and a second end of the bond wire 168 is connected (e.g., soldered) to the ground pad 164. In alternative configurations, the first end of the bond wire 168 may be connected to one of the side shield layers 152 of the EMI shield 150, or multiple bond wires 168 may be connected between the EMI shield 150 (e.g., at the top shield layer 151 and/or the side shield layer(s) 152) and multiple ground pads 164, without departing from the scope of the present teachings. The bond wire 168 is formed of any compatible electrically conductive material, such as gold (Au), silver (Ag), aluminum (Al) or copper (Cu), for example. The electrical pads 141, 142 and 143 of the self-shielded die 102 are connected to signal pads 171, 172 and 173, respectively (e.g., also using solder), as discussed above.

Figure 1D:
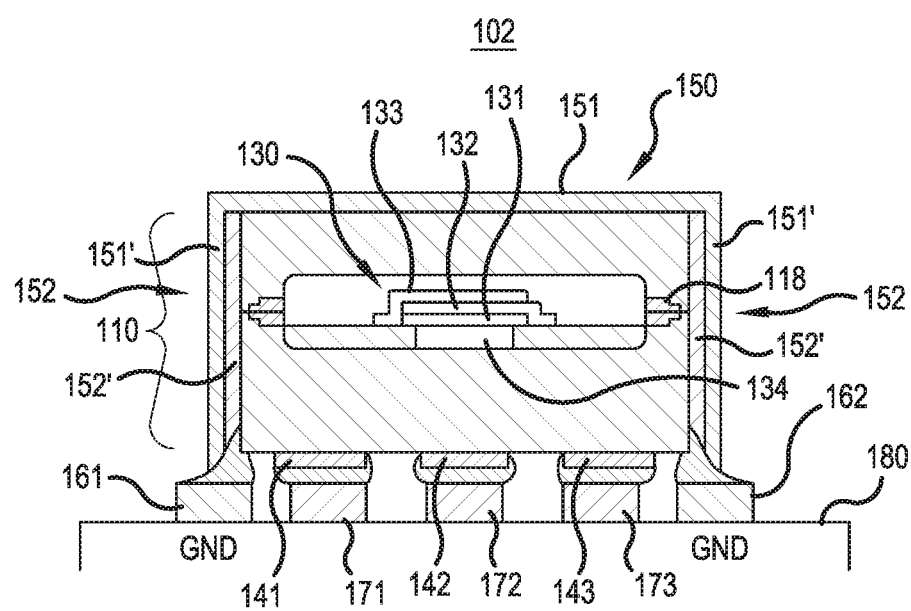
FIG. 1D is a simplified cross-sectional view of a self-shielded die with an attached EMI shield, having multi-layered side shields, directly grounded to ground pads, according to a representative embodiment.

As mentioned above, in alternative embodiments, portions 151' of the top shield layer 151, which is applied after the self-shielded die has been separated from the wafer (as mentioned above), may extend down all or part of the sides of the self-shielded die 102, covering corresponding portions 152' of the side shield layers 152, which had been previously applied at the wafer level. An example of one such embodiment is shown in FIG. 1D, which is grounded the same as shown FIG. 1A. Of course, the portions 151' and 152' of the side shield layer 152 may be included on the self-shielded die, and grounded as shown in FIGS. 1B and 1C, without departing from the scope of the present teachings.

Referring to the example in FIG. 1D, each of the portions 151' overlaps with the entire length of each of the portions 152' of the side shield layers 152, respectively, from the second surface to the first surface of the hybrid substrate 110, to form multi-layered side shield layers. Also, each of the portions 151' and 152' are shown as having substantially uniform thicknesses, respectively. However, when the portions 152' are applied at the wafer level and the portions 151' are subsequently applied at the package level, each of the portions 151' may be tapered, becoming narrower toward the bottom (first surface) of the hybrid substrate 110. This is because the portions 151' are applied indirectly to the sides of the hybrid substrate 110, e.g., using chemical vapor deposition (CVD) or sputtering, as compared to direct deposition of the conductive material on the top shield layer 151.

Figure 2:
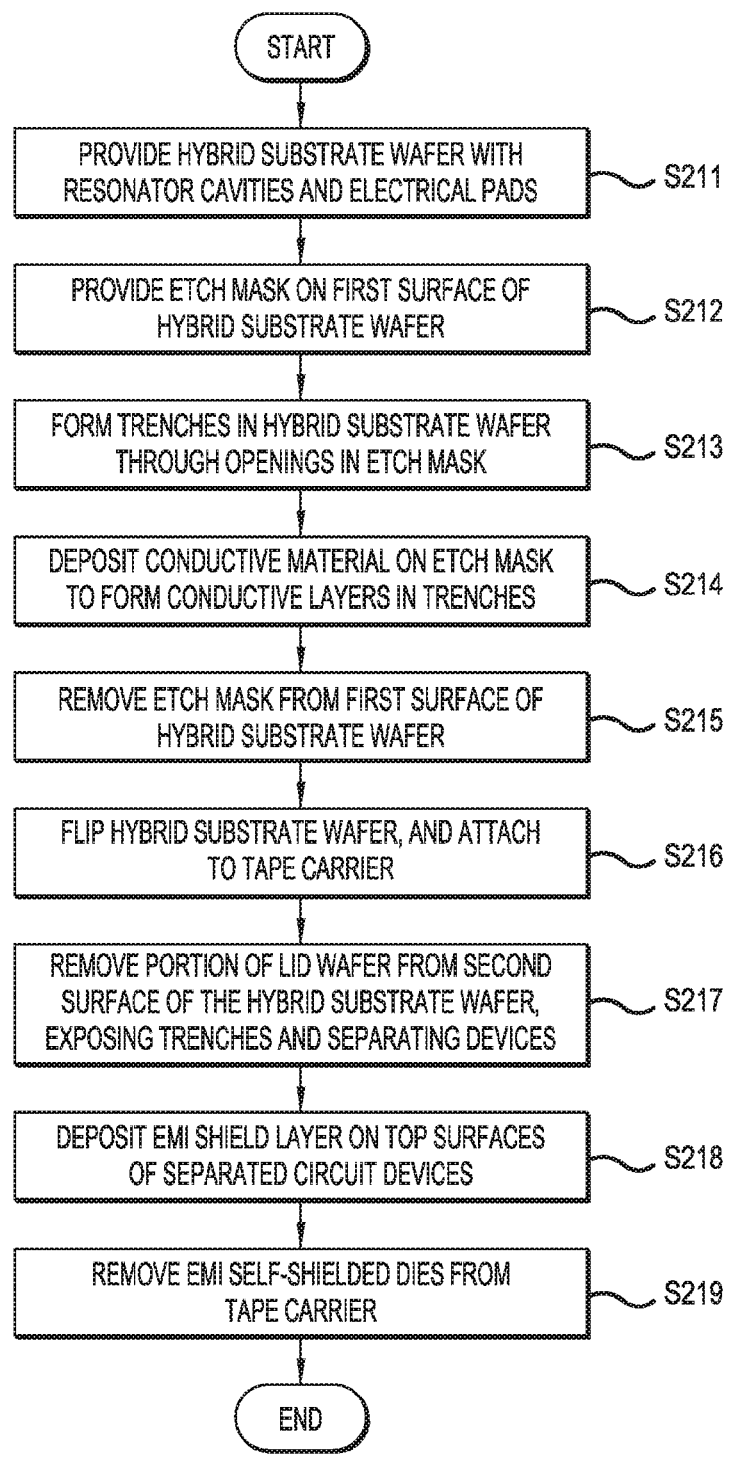
FIG. 2 is a flow diagram showing a method of fabricating a self-shielded die having a hybrid substrate and an attached EMI shield with side shield layers formed at the wafer level, according to a representative embodiment.

FIG. 2 is a flow diagram showing a method of fabricating a self-shielded die having a hybrid substrate and an attached EMI shield, with side shield layers formed at the wafer level, according to a representative embodiment. FIGS. 3A to 3I are simplified cross-sectional views showing various steps in a method of fabricating a self-shielded die having a hybrid substrate and an attached EMI shield with side shield layers formed at the wafer level, according to a representative embodiment.

Figure 3A:
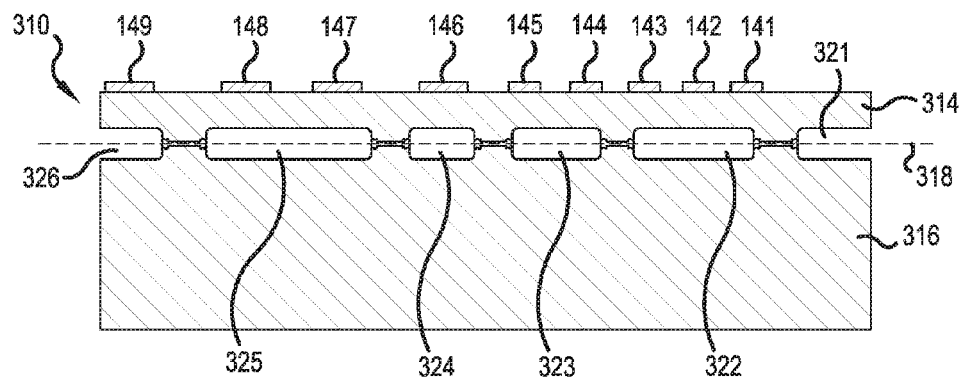
FIGS. 3A to 3I are simplified cross-sectional views showing various steps in a method of fabricating a self-shielded die having a hybrid substrate and an attached EMI shield with side shield layers formed at the wafer level, according to a representative embodiment.

Referring to FIGS. 2 and 3A-3I, a hybrid substrate wafer 310 is provided in block S211. The hybrid substrate wafer 310 has a base wafer 314 and a lid wafer 316 bonded together, the bonding area indicated by line 318, as shown in FIG. 3A. Each of the base wafer 314 and the lid wafer 316 is formed of a substrate material compatible with semiconductor processes, such as silicon (Si), gallium arsenide (GaAs), indium phosphide (InP), glass, sapphire, alumina, epoxy, bismaleimide triazine (BT), prepreg composites, reinforced or non-reinforced polymer dielectrics, for example, and correspond to the materials of the base substrate 114 and the lid substrate 116, respectively. Example descriptions of bonded base and lid wafers are provided in U.S. Pat. No. 8,232,845 to Ruby et al. (Jul. 21, 2012), and U.S. Pat. No. 6,265,246 to Ruby et al. (Jul. 24, 2001), which are hereby incorporated by reference in their entireties.

The bonded base wafer 314 and lid wafer 316 define internal cavities, indicated by representative cavities 321 to 326, each of which includes an acoustic filter comprising at least one acoustic resonator, such as illustrative FBAR 130 (not shown in FIGS. 3A to 3I), described above. The cavities 321 to 326 may be previously formed in the base wafer 314 and/or the lid wafer 316 using compatible cavity formation techniques, such as wet or dry etching, as would be apparent to one skilled in the art. For example, a portion of each of the cavities 321 to 326 may be formed in each of the base wafer 314 and the lid wafer 316 (as shown in FIG. 3A), such that the complete cavities 321 to 326 are created when the base wafer 314 and the lid wafer 316 are bonded together. Alternatively, cavities 321 to 326 may be formed entirely in one of the base wafer 314 or the lid wafer 316, respectively, such that the bonding of the base wafer 314 and the lid wafer 316 simply encloses the already formed cavities.

Electrical pads, indicated by representative electrical pads 141 to 149, are disposed on a first surface of the hybrid substrate wafer 310, where the first (outer) surface of the hybrid substrate wafer 310 corresponds to an outer surface of the base wafer 314. At least some of the electrical pads 141 to 149 are electrically connected to corresponding electrodes of the FBARs (or other acoustic resonators) positioned within the cavities 322 to 326, respectively. The electrical pads 141 to 149 may be formed of any conductive material compatible with semiconductor processes, such as gold (Au), silver (Ag), aluminum (Al) or copper (Cu), for example, using any compatible technique for electrical pad formation. It is understood that the electrical pads 141 to 149 are illustrative, and that alternative numbers and arrangements of electrical pads may be implemented, depending on design and configuration requirements, without departing from the scope of the present teachings.

Figure 3B:
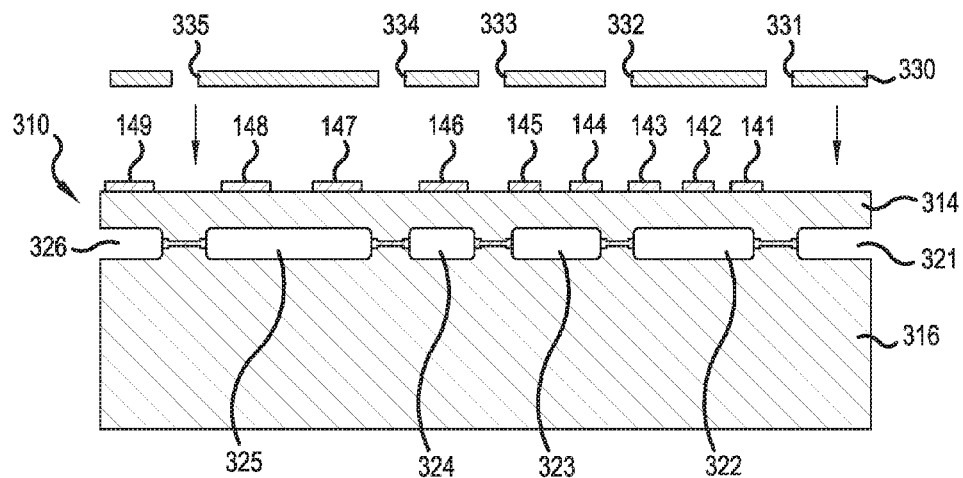

In block S212, an etch mask 330 is provided on the first surface of the hybrid substrate wafer 310, indicated by downward arrows in FIG. 3B. The etch mask 330 is configured to cover at least some of the electrical pads 141 to 149, and defines multiple openings, indicated by representative openings 331 to 335, in between certain adjacent electrical pads 141 to 149. More particularly, the openings 331 to 335 correspond to separation locations where the various circuit devices will ultimately be separated from one another (to form self-shielded dies, such as self-shielded die 102 shown in FIGS. 1A to 1D and self-shielded die 302' in FIG. 3I), depending on design specifications. In the depicted example, the separation locations are between adjacent cavities 321 to 326, such that each circuit device (and subsequent self-shielded die) will include one of the cavities 321 to 326.

Figure 3C:
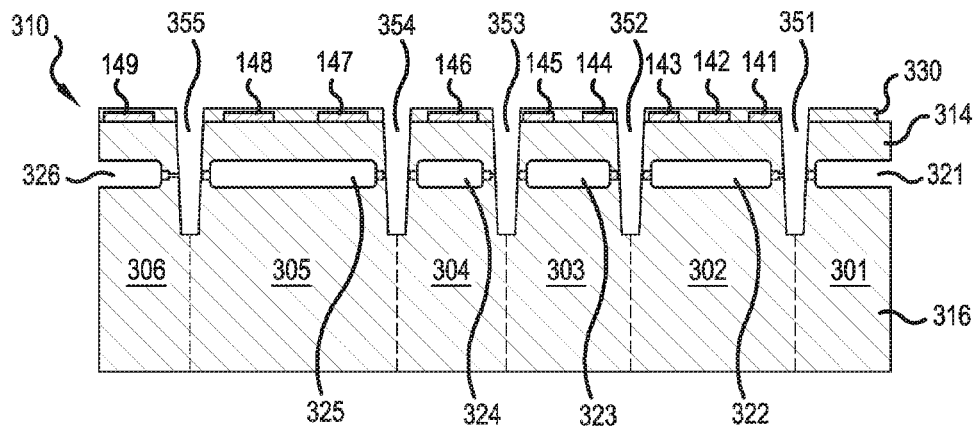

In block S213, trenches 351 to 355 are formed in the hybrid substrate wafer 310 through the openings 331 to 335 in the etch mask 330 between certain of the electrical pads 141 to 149 and between certain of the cavities 321 to 326, respectively, as shown in FIG. 3C, for example. In the depicted example, trench 351 is formed between cavities 321 and 322 (adjacent electrical pad 141), trench 352 is formed between cavities 322 and 323 (between electrical pads 143 and 144), trench 353 is formed between cavities 323 and 324 (between electrical pads 145 and 146), trench 354 is formed between cavities 324 and 325 (between electrical pads 146 and 147), and trench 355 is formed between cavities 325 and 326 (between electrical pads 148 and 149). The trenches 351 to 355 extend from the first surface of the hybrid substrate wafer 310 through the base wafer 314 into the lid wafer 316, thereby defining multiple circuit devices 301 to 306 separated from each other by the trenches 351 to 355. Each of the circuit devices 301 to 306 may includes one of the cavities 321 to 326 and corresponding acoustic resonator (e.g., FBARs 130) and/or one or more of the electrical pads 141 to 149, as shown. The trenches 351 to 355 may be formed using any compatible trenching technique, such as plasma etching or mechanical dicing, for example, although other techniques may be incorporated without departing from the scope of the present teachings.

Figure 4:
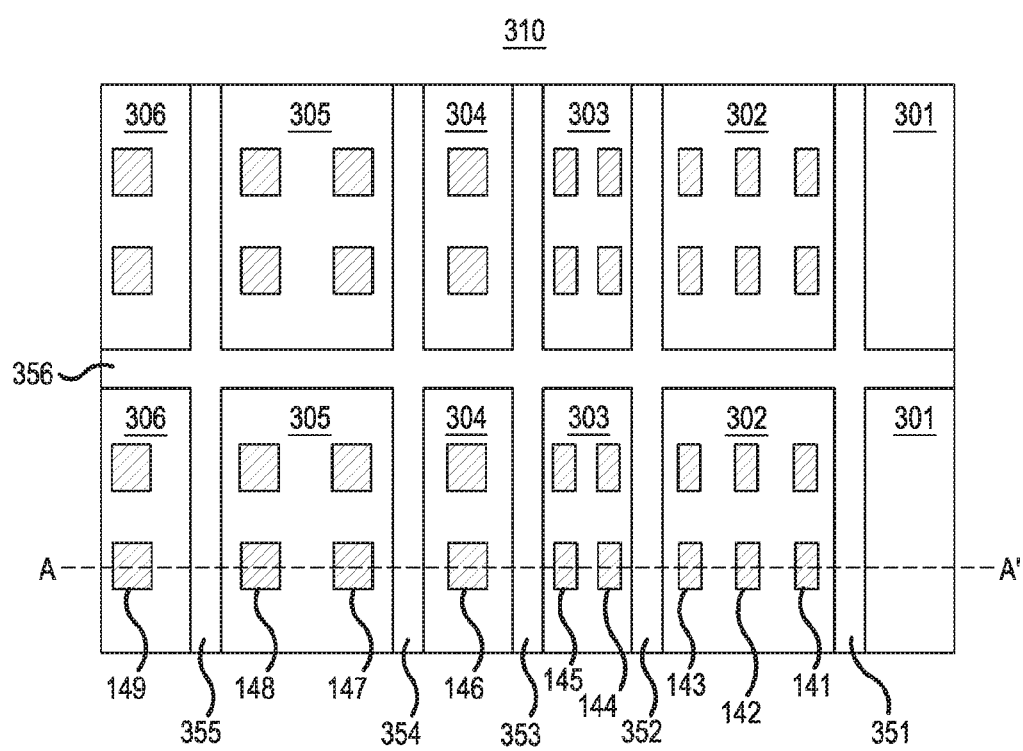
FIG. 4 is a simplified top plan view of a hybrid substrate wafer after trenches have been formed at the wafer level, according to a representative embodiment.

Notably, the trenches 351 to 355 extend along the entire width of the hybrid substrate wafer 310, as shown in FIG. 4, for example. In particular, FIG. 4 is a simplified top plan view of the hybrid substrate wafer 310 after the trenches 351 to 355 have been formed at the wafer level, according to a representative embodiment, where the cross-sectional view of the hybrid substrate wafer 310 shown in FIG. 3C, for example, is taken along line A-A' of FIG. 4. In addition to the trenches 351 to 355 crossing the width of the hybrid substrate wafer 310, FIG. 4 further shows trench 356 crossing the length of the hybrid substrate wafer 310, forming a grid-like pattern. The trench 356 also extends from the first surface of the hybrid substrate wafer 310 through the base wafer 314 into the lid wafer 316, thereby defining additional circuit devices 301 to 306, respectively. Of course, the patterns and numbers of circuit devices (as well as the circuitry designs) included in hybrid substrate wafers may vary to provide unique benefits for any particular situation or to meet application specific design requirements of various implementations, without departing from the scope of the present teachings.

Figure 3D:
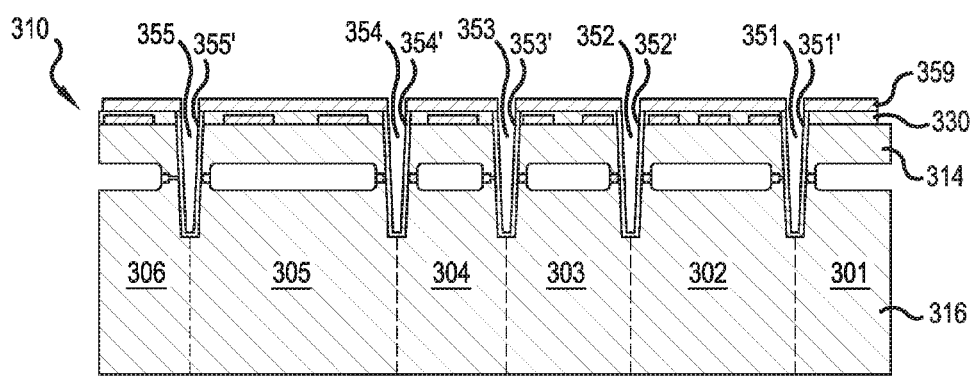

In block S214, a conductive material 359 is deposited on the etch mask 330 over the first surface of the hybrid substrate wafer 310 to form conductive layers (e.g., metal layers) 351' to 355' in the trenches 351 to 355, which process may be referred to as sidewall metallization, as shown in FIG. 3D. Each of the conductive layers 351' to 355' in the trenches 351 to 355 extend through the base wafer 314 into the lid wafer 316, and have a substantially uniform thickness along the sides of the respective trenches 351 to 355. The conductive material may be any compatible electrically conductive material, such as titanium (Ti), copper (Cu) and/or gold (Au), and may be applied using CVD or thin plating, for example. Other materials and application techniques may be incorporated without departing from the scope of the present teachings. The conductive layers 351' to 355' provide protective EMI coatings to sides of acoustic resonators in the cavities 321 and 322, and also provide additional hermetic seals at the connection between the base wafer 314 and the lid wafer 316.

Figure 3E:
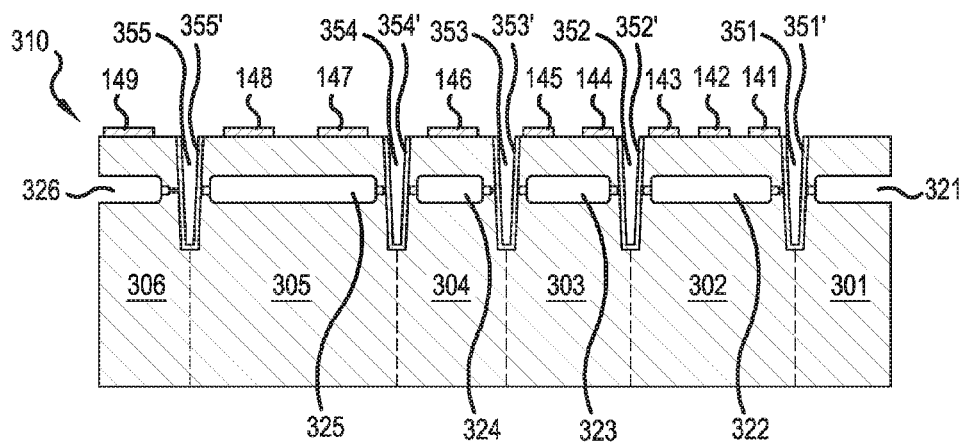

The etch mask 330 is removed from the first surface of the hybrid substrate wafer 310 in block S215, thereby exposing the electrical pads 141 to 149. In alternative embodiments, only some of the etch mask 330 may be removed, exposing fewer than all of the electrical pads 141 to 149, depending on design requirements. In the process of removing the etch mask 330, any portions of the conductive material 359 remaining on the etch mask 330 (that is, conductive material not applied to the sidewalls of the trenches 351 to 355) is likewise removed along with the etch mask 330, as shown in FIG. 3E. This may be accomplished using a lift-off technique, for example, although the etch mask 330 and portions of the conductive material 359 remaining on the etch mask 330 may be removed by alternative techniques, without departing from the scope of the present teachings.

Figure 3F:
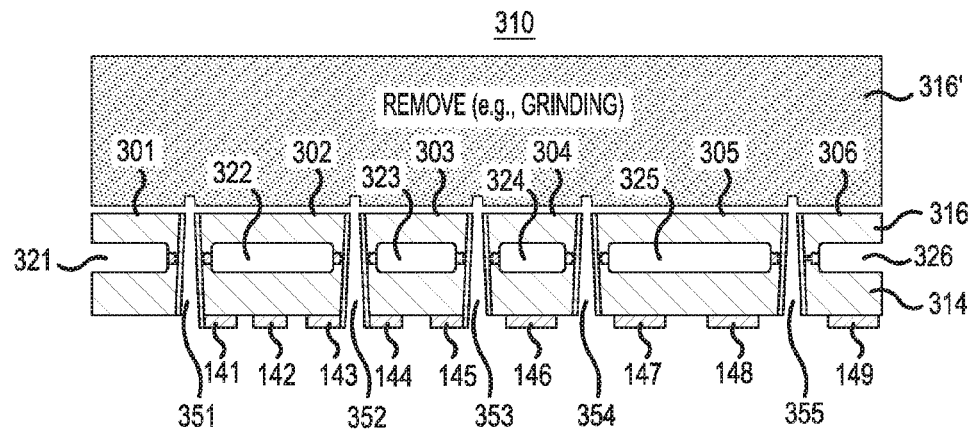

In block S216, the hybrid substrate wafer 310 is flipped, as shown in FIG. 3F. Also, the first surface of the hybrid substrate wafer 310 is attached to a carrier (e.g., tape, tape with frame, or combination of tape with supporting base).

Figure 3G:
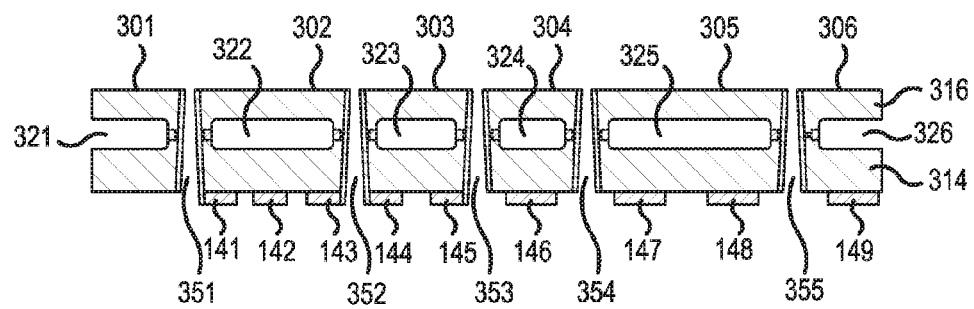

In block S217, a portion 316' of the lid wafer 316 is removed from a second surface of the hybrid substrate wafer 310, opposite the first surface, so as to expose open ends of the trenches 351 to 355 (and conductive layers 351' to 355'), respectively. The portion 316' may be removed by mechanically grinding the lid wafer 316 from the backside thereof (corresponding to the second surface of the hybrid substrate wafer 310), as shown in FIG. 3F, for example. The trenches 351 to 355 now extend completely through both the base wafer 314 and the remaining lid wafer 316 due to removal of the portion 316' of the lid wafer 316, causing separation of the circuit devices 301 to 306 from one another, and also exposing a top surface of each of the individual circuit devices 301 to 306, as shown in FIG. 3G. Since the hybrid substrate wafer 310 had been previously flipped (e.g., in block S216), the top surface of each of the circuit devices 301 to 306 corresponds to what had been the second surface of the hybrid substrate wafer 310.

Figure 3H:
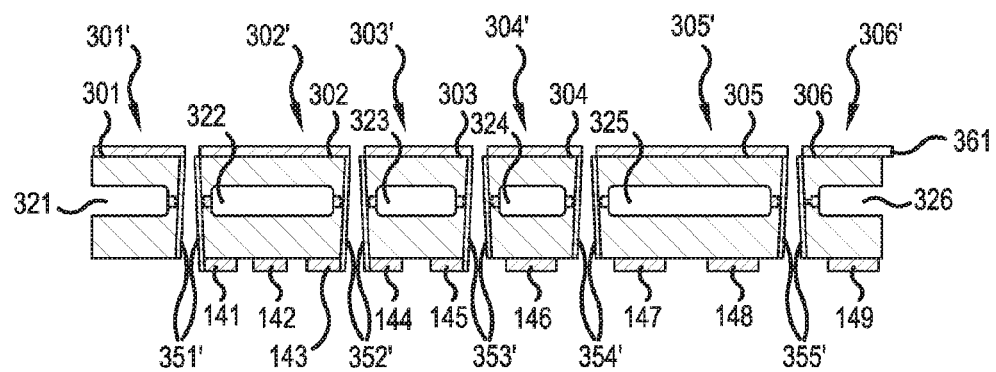

In block S218, a top shield layer 361 is deposited on top surfaces of the circuit devices 301 to 306. The top shield layer 361 on the top surfaces of the circuit devices 301 to 306 contact the conductive layers 351' to 355' on the side surfaces of the circuit devices 301 to 306 (initially corresponding to the metalized sides of the trenches 351 to 355 formed at the wafer level), respectively, to provide corresponding EMI shields for self-shielded dies 301' to 306', as shown in FIG. 3H. As discussed above, the thickness of the top shield layer 361 on each of the top surfaces of the self-shielded dies 301' to 306' may be greater than the thickness of each of the conductive layers 351' to 355' (EMI shield layers on each of the side surfaces of the circuit devices 301 to 306), as discussed above. Also, the conductive material of the top shield layer 361 may also extend into the openings of the trenches 351 to 355, at least partially covering the side conductive layers 351' to 355', respectively (not shown in FIG. 3H), as discussed above.

The self-shielded dies 301' to 306' are removed from the carrier in block S219. At least one of the self-shielded dies 301' to 306' removed from the carrier may be attached to a package substrate (e.g., PCB, metal lead frame, a laminate circuit board, a ceramic or silicon based substrate, or the like), including electrically connecting at least one electrical pad of to a corresponding electrical pad on the package substrate. More particularly, the at least one of the self-shielded dies 301' to 306' may be attached to the package substrate via corresponding electrical pads (e.g., electrical pads 141 to 143 for the self-shielded dies 302', electrical pads 144 and 145 for the self-shielded die 303', electrical pad 146 for the for the self-shielded die 304', electrical pads 147 and 148 for the for the self-shielded die 305', and electrical pad 149 for the for the self-shielded die 306').

Figure 3I:
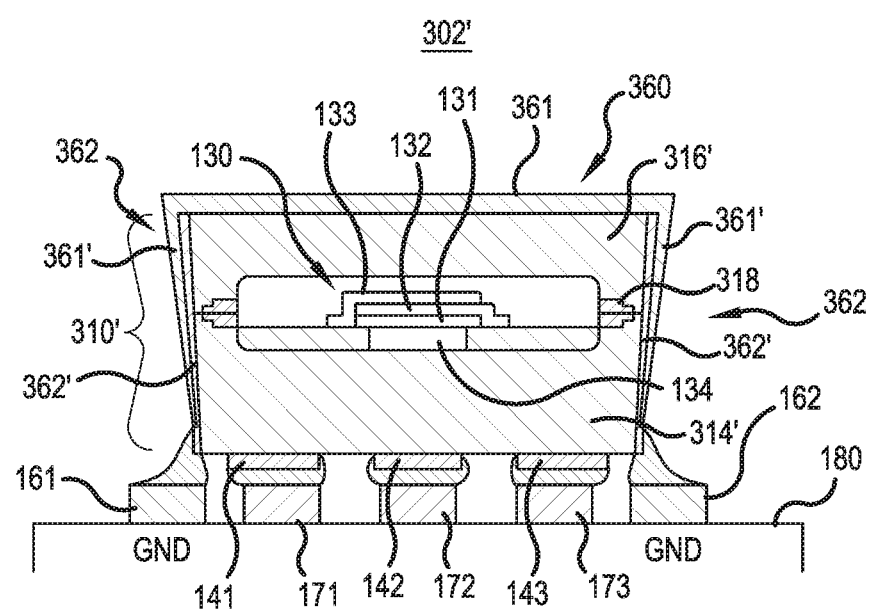

FIG. 3I is an expanded simplified cross-sectional view of one of the self-shielded dies (i.e., self-shielded die 302'), having an attached EMI shield 360, fabricated using the process described in FIG. 2 and attached to a package substrate 180. Additional self-shielded die(s), such as illustrative self-shielded dies formed from singulated circuit devices 301 and 303-306, may also be attached to the package substrate 180. The self-shielding characteristics of adjacent self-shielded dies substantially eliminate the need for additional shielding between dies, and therefore the self-shielded dies may be arranged closer together than in conventional package devices. The self-shielded die 302' is shown grounded by ground pads 161 and 162 (e.g., using solder) as shown in FIG. 1A, although any of the illustrative grounding techniques, e.g., shown in FIGS. 1A to 1C may be incorporated, without departing from the scope of the present teachings. In comparison to FIGS. 1A to 1C, the EMI shield 360 corresponds to the EMI shield 150, the top shield layer 361 corresponds to the top shield layer 151, and the side shield layers 362 (comprising portions 361' and 362', discussed below) correspond to the side shield layers 152.

Referring to FIG. 3I, the self-shielded die 302' includes a hybrid substrate 310', which is the portion of the hybrid substrate wafer 310 associated with the self-shielded die 302'. The hybrid substrate 310' includes a base substrate 314' and a lid substrate 316' bonded together, as indicated by line 318. The self-shielded die 302' defines the cavity 322 in which an acoustic filter is arranged, as indicated by representative FBAR 130, discussed above. Of course, other types of acoustic resonators and/or electronic devices may be located in the cavity 322, without departing from the scope of the present teachings. The self-shielded die 302' has illustrative electrical pads 141, 142 and 143, disposed on a first (bottom) surface of the hybrid substrate 310', connected to signal pads 171, 172 and 173, respectively, e.g., using solder. At least one of the electrical pads 141, 142 and 143 is electrically connected to one of the resonator electrodes 131 and/or 133).

The EMI shield 360 substantially completely covers the top surface of the hybrid substrate 310', and further substantially completely covers the sides of the hybrid substrate 310'. In the depicted embodiments, the self-shielded die 302' has four sides for purposes of illustration, although the various embodiments are not limited thereto. The EMI shield 360 includes top shield layer 361 and side shield layers 362. In the depicted example, each of the side shield layers 362 includes a portion 362', which corresponds to conductive layers 351' and 352' formed at the wafer level, and a portion 361', which corresponds to conductive material from the top shield layer 361 that extends down the sides of the hybrid substrate 310' over the portion 362'. In the depicted example, the portions 362' have a substantially uniform thickness, while the overlapping portions 361' are tapered in a direction toward the package substrate 180. This is because the portions 361' are applied indirectly to the sides of the hybrid substrate 310', e.g., using CVD or sputtering, as compared to direct deposition of the conductive material of the top shield layer 361 on the top surface of the hybrid substrate 310'. The multi-layered side shield layers 362, including the portions 361' and 362', provide additional EMI shielding on the sides of the self-shielded die 302', as discussed above with reference to FIG. 1D.

Also, the sides of the hybrid substrate 310' are slanted inward in a direction toward the bottom of the self-shielded die 302'. This is a result of the substantially cone-shaped trenches 351 and 352 on either side of the circuit device 302, which were inverted when the hybrid substrate wafer 310 was flipped in block S216. The orientation of the sides of the hybrid substrate 310' may therefore vary, depending for example on the shapes of the trenches 351 and 352. For example, if trenches 351 and 352 were formed with parallel sides, then the hybrid substrate 310' would have a substantially rectangular cross-section.

It is understood that alternative methods of fabricating self-shielded dies may be incorporated without departing from the scope of the present teaches. For example, the corresponding circuit devices may be singulated from a wafer using conventional techniques, such as sawing or scribe and break, instead of forming trenches and grinding away the back side of the wafer, as in block S217. Without the trenches and/or metallization of the same (or other pre-singulation metallization technique), there would be no initial layer of conductive material on the sides of the circuit devices while still part of the wafer (that is, no wafer level side shield layers). The singulated circuit devices may then be attached to a carrier, as in block S216 of FIG. 2, and individually coated with a conductive layer on all sides, e.g., using CVD or sputtering. Further, in alternative embodiments, the wafer may not be a hybrid substrate wafer, but rather comprise a single substrate. Thus, electronic devices, such as acoustic filters, CMOS devices and/or SMT devices, are formed on a surface of the wafer. After flipping the wafer and singulating (by any means) the circuit devices, conductive layers may be applied (e.g., directly to bare surfaces of the singulated circuit devices and/or to initial layers of conductive material applied to the circuit devices at the wafer level) to form corresponding self-shielded dies.

Figure 5A:
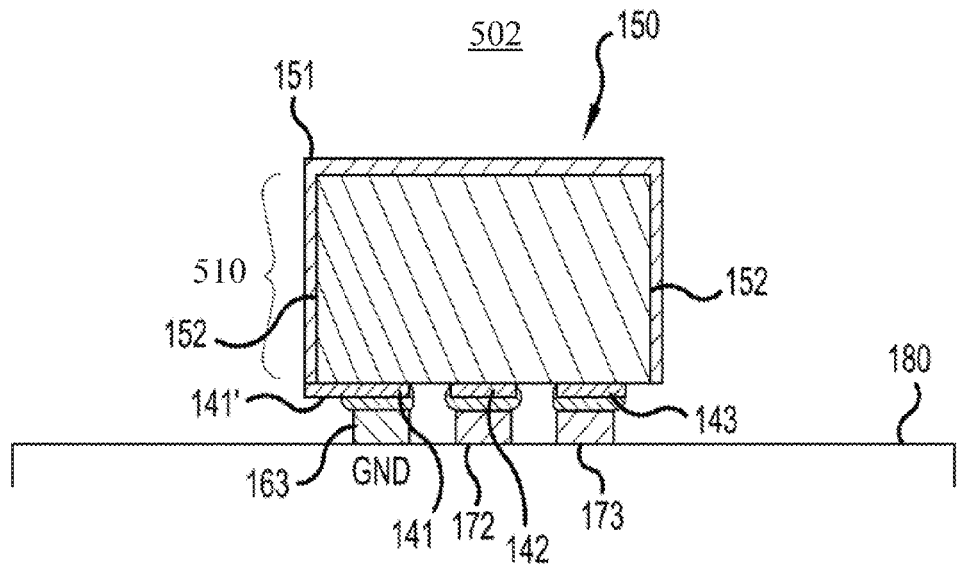
FIG. 5A is a simplified cross-sectional view of a self-shielded die (without internal cavity) with an attached EMI shield, having a metal extension in contact with a side shield layer, according to a representative embodiment.
Figure 5B:
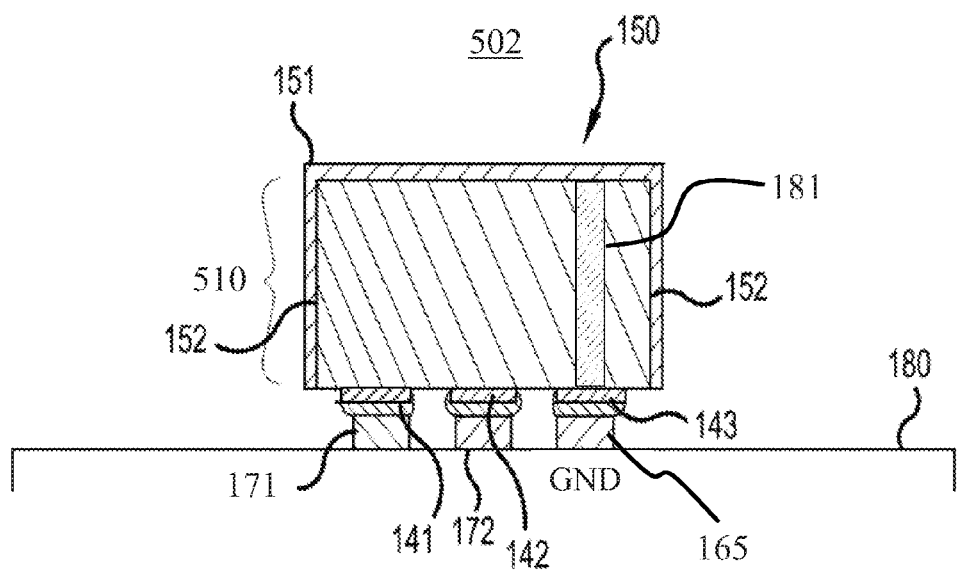
FIG. 5B is a simplified cross-sectional view of a self-shield die (without internal cavity) with an attached EMI shield, having a metalized through-wafer via in contact with a ground pad of the die, according to a representative embodiment.

FIG. 5A is a simplified cross-sectional view of a self-shielded die (without internal cavity) with an attached EMI shield, having a metal extension in contact with a side shield layer, and FIG. 5B is a simplified cross-sectional view of a self-shielded die (without internal cavity) with an attached EMI shield, having a metalized through-wafer via in contact with a ground pad of the die, according to representative embodiments. FIGS. 5A and 5B show configurations of a self-shielded die 502 for a conventional CMOS device, for example, with conductive top shield layer 151 and side shield layers 152 applied to top and side surfaces of substrate 510. The self-shielded die 502 is similar to the self-shielded die 102, described above with reference to FIGS. 1A to 1D, but the self-shielded die 502 has a single substrate 510, as opposed to a hybrid substrate 110 having a base substrate 114 and a lid substrate 116 bonded together.

Referring to FIG. 5A, the self-shielded die 502 has one or more electrical pads, indicated by representative electrical pads 141, 142 and 143, disposed on a first (bottom) surface of the substrate 510. The EMI shield 150 substantially completely covers a second (top) surface of the substrate 510, and further substantially completely covers the sides of the substrate 510, shielding the CMOS device (and/or any other electronic device part of the self-shielded die 502). The EMI shield 150 comprises a top shield layer 151 and side shield layers 152. The top shield layer 151 is applied to the second surface of the substrate 510 after the self-shielded die 502 has been separated from other dies, which were originally part of the same wafer as the self-shielded die 502, during the fabrication process, as discussed above with reference to fabrication of the self-shielded die 102. The side shield layers 152 of the EMI shield 150 may be applied along with the top shield layer at the package level, or in various embodiments, all or a portion of the side shield layers 152 may be applied at the wafer level, meaning before the self-shielded die 502 has been separated from the other dies in the same wafer. An example of applying the side shield layers 152 at the wafer level is described above.

To enable connection ground, the electrical pad 141 includes a metal extension 141' that extends across the first surface to the edge (or slightly beyond the edge) of the substrate 510. Accordingly, the side shield layer 152 on the same side of the substrate 510 as the electrical pad 141 contacts the metal extension 141'. The electrical pad 141 and/or the metal extension 141' are connected to a ground pad 163 (e.g., using solder), and the electrical pads 142 and 143 are connected to the signal pads 172 and 173, respectively (e.g., also using solder), as discussed above.

Referring to FIG. 5B, the self-shielded die 502 is substantially the same as described with reference to FIG. 5A, except for the manner of electrical grounding. That is, the self-shielded die 502 includes metalized through-wafer via 181, which passes through the substrate 510 and connecting the top shield layer 151 of the EMI shield 150 to the electrical pad 143. The electrical pad 143 is connected to a ground pad 165 (e.g., using solder), and the electrical pads 141 and 142 are connected to the signal pads 171 and 172, respectively (e.g., also using solder), as discussed above. Of course, the metalized through-wafer via 181 may be connected to other electrical pads and/or other portions of the EMI shield 150, or there may be multiple metalized through-wafer vias, in various configurations, without departing from the scope of the present teachings. Also, the grounding techniques shown in FIGS. 5A and 5B may be combined with one another and/or combined with other ground techniques, including the examples shown in FIGS. 1A and 1C, without departing from the scope of the present teachings.

The various components, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A self-shielded die, comprising:
   a hybrid substrate comprising a base semiconductor substrate and a lid semiconductor substrate, bonded to the base semiconductor substrate;
   an electronic device attached to the base semiconductor substrate in a cavity pre-formed between the base and lid semiconductor substrates;
   one or more electrical pads disposed on a bottom surface of the base semiconductor substrate, at least one of the one or more electrical pads being electrically connected to the electronic device; and
   an electromagnetic interference (EMI) shield formed of at least one electrically conductive material and connected to ground, the EMI shield comprising a top shield layer, disposed directly on and substantially completely covering a top surface of the hybrid substrate opposite the bottom surface of the hybrid substrate, and side shield layers substantially completely covering all sides of the hybrid substrate, extending between the top surface of the hybrid substrate and the bottom surface of the hybrid substrate.

2. The self-shielded die of claim 1, wherein the EMI shield effectively forms a Faraday cage around the electronic device.

3. The self-shielded die of claim 1, wherein at least a portion of the at least one electrically conductive material of the side shield layers of the EMI shield comprises a wafer level metal layer.

4. The self-shielded die of claim 3, wherein an additional portion of the at least one electrically conductive material of the side shield layers comprises a metal layer extending from the top shield layer down the sides of the hybrid substrate, over at least a portion of the wafer level metal layer, the additional portion of the at least one electrically conductive material being the same material as the top shield layer.

5. The self-shielded die of claim 1, wherein the at least one electrically conductive material of the side shield layers comprises a single metal layer, which extends from the top shield layer down at least a portion of the sides of the hybrid substrate.

6. The self-shielded die of claim 1, wherein the EMI shield is connected to ground via a solder joint between at least one of the side shield layers and a corresponding at least one ground pad on a package substrate to which the self-shielded die is attached.

7. The self-shielded die of claim 1, wherein one electrical pad of the one or more electrical pads disposed on the bottom surface of the hybrid substrate is connected to a ground pad on a package substrate to which the self-shielded die is attached, the one electrical pad including a metal extension that extends across the bottom surface of the hybrid substrate to at least an edge of the hybrid substrate, and
   wherein the EMI shield is connected to ground via the metal extension of the one electrical pad.

8. The self-shielded die of claim 1, wherein the EMI shield is connected to ground via a bond wire directly connected to a ground pad on a package substrate to which the self-shielded die is attached.

9. The self-shielded die of claim 1, wherein the electronic device is an acoustic filter comprising a bulk acoustic wave (BAW) resonator arranged in the cavity.

10. The self-shielded die of claim 1, wherein one electrical pad of the one or more electrical pads disposed on the bottom surface of the hybrid substrate is connected to a ground pad on a package substrate to which the self-shielded die is attached, and
    wherein the EMI shield is connected to ground by a metalized through-wafer via that passes through the hybrid substrate and is connected to the one electrical pad connected to the ground pad.

11. A device, comprising:
    a hybrid substrate comprising a base substrate and a lid substrate, bonded together, and defining an internal cavity between the bonded base and lid substrates, each of the base substrate and the lid substrate being formed of a semiconductor material;
    a film bulk acoustic wave resonator (FBAR), including a pair of electrodes, arranged in the cavity;
    one or more electrical pads disposed on a bottom surface of the hybrid substrate, at least one of the one or more electrical pads being electrically connected to one of the electrodes; and
    an electromagnetic interference (EMI) shield formed of at least one electrically conductive material and electrically connected to ground, the EMI shield comprising a top shield layer, disposed directly on and substantially completely covering a top surface of the hybrid substrate opposite the bottom surface of the hybrid substrate, and side shield layers substantially completely covering all sides of the hybrid substrate, extending between the top surface of the hybrid substrate and the bottom surface of the hybrid substrate,
    wherein the side shield layers include wafer level deposits of the at least one electrically conductive material.

12. The device of claim 11, further comprising a package substrate to which the hybrid substrate is attached, wherein at least one of the electrical pads disposed on the bottom surface of the hybrid substrate is electrically connected to a ground pad on the package substrate, and
    wherein the EMI shield is directly connected to the at least one of the electrical pads electrically connected to a ground pad.

13. The device of claim 11, further comprising a package substrate to which the hybrid substrate is attached, wherein the package substrate includes at least one ground pad, and wherein the EMI shield is soldered directly via at least one of the side shield layers to the at least one ground pad of the package substrate.

14. The device of claim 11, further comprising a package substrate to which the hybrid substrate is attached, wherein the package substrate includes at least one ground pad, and wherein the device further comprises a bond wire directly connecting the at least one ground pad to the EMI shield.

15. The device of claim 11, further comprising at least one copper pillar provided on at least one of the one or more electrical pads.

16. A package device, comprising:
    a package substrate;
    a first self-shielded die connected to the package substrate, the first self-shielded die comprising:
    a first hybrid semiconductor substrate;
    a first acoustic filter arranged in an internal cavity defined by the first hybrid semiconductor substrate;

one or more first electrical pads disposed on a bottom surface of the first hybrid semiconductor substrate, at least one of the first electrical pads being electrically connected to the first acoustic filter; and a first electromagnetic interference (EMI) shield formed of an electrically conductive material and connected to ground, the first EMI shield comprising a first top shield layer, disposed directly on and substantially completely covering a top surface of the first hybrid semiconductor substrate opposite the bottom surface of the first hybrid semiconductor substrate, and first side shield layers substantially completely covering all sides of the first hybrid semiconductor substrate; and a second self-shielded die connected to the package substrate adjacent the first self-shielded die, the second self-shielded die comprising:

a second hybrid semiconductor substrate;

a second acoustic filter attached to the second hybrid semiconductor substrate;

one or more second electrical pads disposed on a bottom surface of the second hybrid semiconductor substrate, at least one of the second electrical pads being electrically connected to the second acoustic filter; and a second EMI shield formed of an electrically conductive material and connected to ground, the second EMI shield comprising a second top shield layer, disposed directly on and substantially completely covering a top surface of the second hybrid semiconductor substrate opposite the bottom surface of the second hybrid semiconductor substrate, and second side shield layers substantially completely covering all sides of the second hybrid semiconductor substrate.

17. The package device of claim 16, wherein a distance between the first self-shielded die and the second self-shielded die is less than about 90 µm.

18. The self-shielded die of claim 1, wherein the base semiconductor substrate and the lid semiconductor substrate are formed of the same semiconductor material.

19. The self-shielded die of claim 1, wherein the base semiconductor substrate and the lid semiconductor substrate are formed of different semiconductor materials having approximately the same coefficient of thermal expansion (CTE).

20. The self-shielded die of claim 1, wherein a portion of the cavity is pre-formed in the base semiconductor substrate and another portion of the cavity is pre-formed in the lid semiconductor substrate, and aligned with the portion of the cavity pre-formed in the base semiconductor substrate.

21. The self-shielded die of claim 1, wherein the cavity is pre-formed entirely in the base semiconductor substrate.

22. The self-shielded die of claim 1, wherein the cavity is pre-formed entirely in the lid semiconductor substrate.

* * * * *